US009548590B2

(12) United States Patent
Caneau et al.

(10) Patent No.: US 9,548,590 B2
(45) Date of Patent: Jan. 17, 2017

(54) QUANTUM CASCADE LASER DESIGN WITH STEPPED WELL ACTIVE REGION

(71) Applicant: Corning Incorporated, Corning, NY (US)

(72) Inventors: Catherine Genevieve Caneau, Corning, NY (US); Feng Xie, Painted Post, NY (US); Chung-En Zah, Holmdel, NJ (US)

(73) Assignee: Thorlabs Quantum Electronics, Inc., Jessup, MD (US)

( * ) Notice: Subject to any disclaimer, the term of this patent is extended or adjusted under 35 U.S.C. 154(b) by 170 days.

(21) Appl. No.: 13/661,559

(22) Filed: Oct. 26, 2012

(65) Prior Publication Data

US 2013/0136148 A1 May 30, 2013

Related U.S. Application Data

(60) Provisional application No. 61/564,375, filed on Nov. 29, 2011.

(51) Int. Cl.
*H01S 5/34* (2006.01)
*B82Y 20/00* (2011.01)

(52) U.S. Cl.
CPC .............. *H01S 5/3402* (2013.01); *B82Y 20/00* (2013.01); *H01S 5/3403* (2013.01); *H01S 5/3407* (2013.01)

(58) Field of Classification Search
CPC .... H01S 5/3401; H01S 5/3402; H01S 5/3403; H01S 5/3407; B82Y 20/00
USPC ........................................................ 372/45.01
See application file for complete search history.

(56) References Cited

U.S. PATENT DOCUMENTS

| 5,978,397 | A | 11/1999 | Capasso et al. ................. 372/45 |
| 6,891,869 | B2 | 5/2005 | Augusto .......................... 372/43 |
| 7,266,279 | B1* | 9/2007 | Yap et al. ....................... 385/131 |
| 7,403,552 | B2 | 7/2008 | Botez et al. ............... 372/43.01 |
| 7,408,966 | B2 | 8/2008 | Botez ......................... 372/45.01 |

(Continued)

FOREIGN PATENT DOCUMENTS

| EP | 2031364 | 3/2009 |
| JP | 2004-119814 | 4/2004 |

(Continued)

OTHER PUBLICATIONS

Beck et al; "Continuous Wave Operation of a Mid-Infrared Semiconductor Laser at Room Temperature"; Science 295,301 (2002).
Botez et al; "The Temperature Dependence of Key Electro-Optical Characteristics for Mid-Infrared Emitting Quantum Cascade Lasers"; Proc. Of SPIE vol. 7953 (2011) 79530N-1-79530N-12.
Carder et al; "Room-Temperature Operation of an InAs-GaAs-AIAs Quantum-Cascade Laser"; Appl. Phys. Lett. 82, 3409 (2003).

(Continued)

*Primary Examiner* — Xinning Niu
(74) *Attorney, Agent, or Firm* — Graham Curtin, P.A.

(57) ABSTRACT

Included are embodiments of a quantum cascade laser structure. Some embodiments include a plurality of quantum wells and a plurality of barriers, at least a portion of which define an active region. In some embodiments, a photon is emitted in the active region when an electron transitions from an upper laser state in the active region to a lower laser state in the active region. Additionally, a final quantum well in the plurality of quantum wells may define the active region, where the final quantum well extends below an adjacent quantum well in the active region. Similarly, the final quantum well may include a thickness that is less than a thickness of the adjacent quantum well in the active region.

20 Claims, 4 Drawing Sheets

(56) References Cited

U.S. PATENT DOCUMENTS

| | | |
|---|---|---|
| 7,558,305 B2 | 7/2009 | Botez et al. .............. 372/43.01 |
| 7,856,042 B2 | 12/2010 | Botez et al. ............. 372/45.012 |
| 8,121,164 B1* | 2/2012 | Lyakh et al. .............. 372/44.01 |
| 2005/0036530 A1 | 2/2005 | Schneider et al. .............. 372/46 |
| 2009/0022196 A1 | 1/2009 | Botez et al. ............. 372/45.012 |
| 2009/0056418 A1 | 3/2009 | Cole et al. ................... 73/31.05 |
| 2011/0007768 A1* | 1/2011 | Yamanishi et al. ........ 372/45.01 |
| 2011/0026556 A1 | 2/2011 | Fujita et al. ............. 372/45.012 |

FOREIGN PATENT DOCUMENTS

| | | | |
|---|---|---|---|
| JP | 2009-80105 | 4/2009 | |
| JP | 2009-152547 | 7/2009 | |
| WO | 2005/065304 | 7/2005 | |
| WO | 2007/112164 | 10/2007 | .............. H01S 5/00 |
| WO | 2008/094311 | 8/2008 | |
| WO | 2011/084201 | 7/2011 | |

OTHER PUBLICATIONS

Katz et al; "Low Threshold Injectorless Quantum Cascade Laser with Four Material Compositions"; Electronics Letters (Apr. 24, 2008) vol. 44 No. 9.

Katz et al; "Towards High-Performance Injectorless Quantum Cascade Lasers in the Mid Infrared"; SPIE vol. 7987 (2011) 79870H-1-79870H-4.

Li et al; "Broad Gain Bandwith Injectorless Quantum-Cascade Lasers with a Step Well Design"; Appl. Phys. Lett. 98 131113 (2011).

Shin et al; "Highly Temperature Insensitive, Deep-Well 4.8 μm Emitting Quantum Cascade Semiconductor Lasers"; Appl. Phys. Lett. 94 201103 (2009).

Shin et al; "Ultra-Low Temperature Sensitive Deep-Well Quantum Cascade Lasers ($\lambda$=4.8 μm) Via Untapering Conduction Band Edge of Injector Regions"; Electronics Letters (Jul. 2, 2009) vol. 45 No. 14.

PCT/US2012/066729 Search Report.

* cited by examiner

QUANTUM CASCADE LASER DESIGN WITH STEPPED WELL ACTIVE REGION

This application claims the benefit of priority under 35 USC §119 of U.S. Provisional Application Ser. No. 61/564,375 filed on Nov. 29, 2011 the content of which is replied upon and incorporated herein by reference in its entirety.

BACKGROUND

The present disclosure relates to quantum cascade lasers (QCL) with a high continuous wave (CW) power at high temperature that can be used in infrared countermeasures, thermal collimating aiming devices, gas sensing, and/or other applications at high environmental temperatures. The concepts of the present disclosure will enjoy broad applicability in a variety of fields where multi-wavelength lasers are used.

BRIEF SUMMARY

The present disclosure is directed to embodiments of a quantum continuous wave laser device. The embodiments of the present disclosure can operate with high temperature performance. More specifically, a quantum cascade laser (QCL) is a unipolar device unlike the traditional direct band gap semiconductor lasers. The QCL generally emits light in a mid-infrared and far-infrared wavelength range. In general, QCLs suffer from performance degradation at high temperatures. Embodiments disclosed herein overcome or reduce these deficiencies, as described below.

In accordance with one embodiment of the present disclosure, a quantum cascade laser structure may be provided. Some embodiments include a plurality of quantum wells and a plurality of barriers, at least a portion of which define an active region. In some embodiments, a photon is emitted in the active region when an electron transitions from an upper laser state in the active region to a lower laser state in the active region. Additionally, a final quantum well in the plurality of quantum wells may define the active region, where the final quantum well extends below an adjacent quantum well in the active region. Similarly, the final quantum well may include a thickness that is less than a thickness of the adjacent quantum well in the active region.

In accordance with another embodiment of the present disclosure, embodiments disclosed herein include a quantum cascade laser structure may be provided. Some embodiments include at least one laser core and at least one cladding layer, forming a waveguide structure, the at least one laser core including a first type of semiconductor material that defines a plurality of quantum wells, the at least one laser core may include a second type of semiconductor materials that define a plurality of barrier. The plurality of quantum wells and the plurality of barriers may define an active region, such that photons are emitted in the active region when electrons transition from an upper laser state in the active region to a lower laser state in the active region. Similarly, the plurality of quantum wells and the plurality of barriers may define an injector region, such that electrons transport from one active region to a next adjacent active region through the injector region. Further, at least one final quantum well of the plurality of quantum wells may include a bottom portion that extends below a major quantum well in the active region when no bias is applied.

In accordance with another embodiment of the present disclosure, embodiments disclosed herein include a quantum cascade laser structure may be provided. Some embodiments include a final quantum well in the active region includes a bottom portion that extends below other quantum wells in the active region. Similarly, a final barrier in the active region may include top portion that extends beyond other barriers in the active region (e.g., has a height that is greater than at least one other barrier in the active region), thereby increasing an energy difference E54 between energy state 4 and energy state 5. The final barrier may include a thickness that is greater than thicknesses of at least one other barrier in the active region.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which.

DETAILED DESCRIPTION

Figure 1:
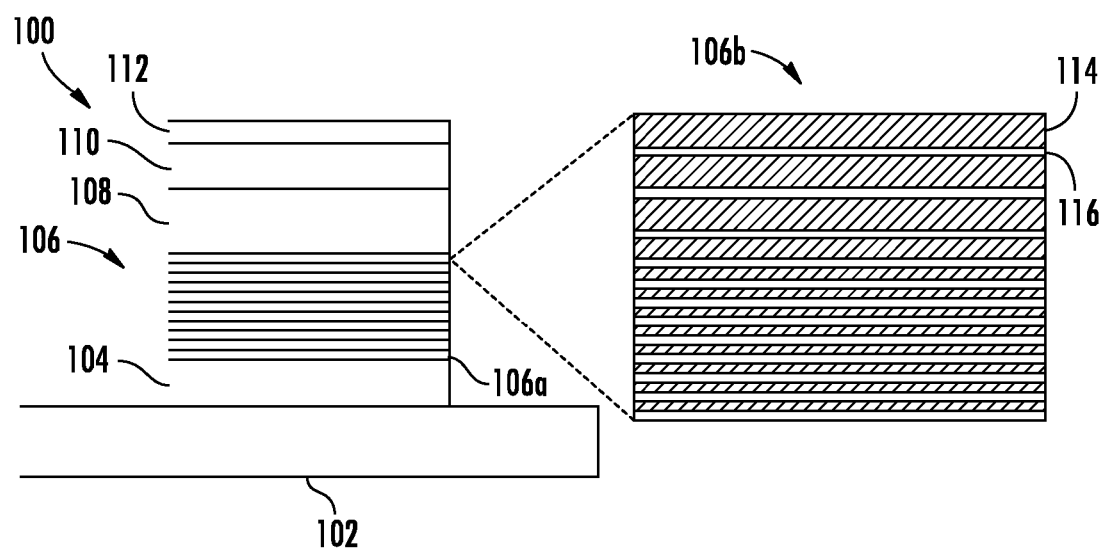
FIG. 1 is a schematic illustration of a quantum cascade laser that includes quantum wells and barriers within an active core.

FIG. 1 is a schematic illustration of a quantum cascade laser (QCL) 100 that includes a plurality of quantum wells and a plurality of barriers within an active core. The QCL 100 includes a substrate 102, which may be composed of Indium Phosphide (InP) or other semiconductor compound. Additionally at least one cladding layer, such as lower cladding layer 104 may be grown on the substrate 102 may be composed of low doped indium Phosphide, and may define a waveguide structure. Also included in the QCL 100 is at least one laser core, such as an active core 106, which may include a plurality of stages 106a, 106b. The stages 106a, 106b in the active core 106 may be composed of a sequence of very thin semiconductor layers, which may be barriers 114 and wells 116, which are made from two semiconductor materials alternatively grown on the top of each other. The difference in the conduction band energy of the two semiconductor materials forms coupled quantum wells, in which quantized electron energy states are located. Depending on the particular embodiment, the quantum wells may be composed of $Ga_xIn_{1-x}As$, while the barriers may be composed of $Al_yIn_{1-y}As$, where both x and y are less than or equal to 1.

Figure 2:
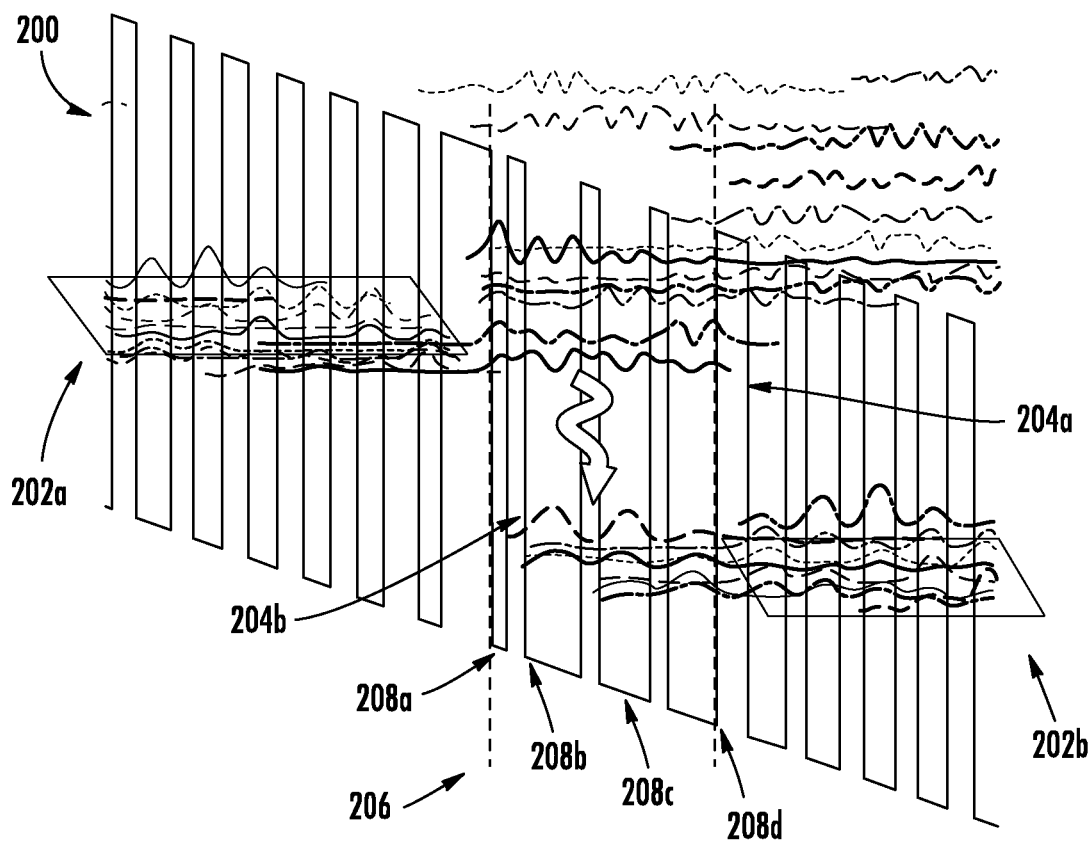
FIG. 2 depicts a band diagram, illustrating emission of photons in a QCL, such as the QCL from FIG. 1.

FIG. 2 depicts a band diagram 200, illustrating the band diagram of a single active stage of the active core in a QCL, such as the QCL 100 from FIG. 1. As illustrated, energy in electron Volts (eV) is shown on the y-axis, while distance in nanometers (nm) is shown in on the x-axis. One active stage is composite of an injector region 202a, 202b and an active region 206. The injector region 202a, 202b may include compositions of entrance quantum wells and exit quantum wells that have a depth that is greater than at least one of the plurality of quantum wells in the active region 206. Similarly, the injector region may include an entrance quantum well that comprises a depth that is greater than at least one of the plurality of quantum wells in the active region. Electrons may transition from one active region to the next adjacent active region through an injector. During the traveling, there are certain possibilities that the electrons can transit from one state to another state. When electrons transit from an upper laser state 204a to a lower laser state 204b in the active region 206, photons may be emitted. In other words, in the particular design of QCL illustrated in FIG. 2, the active region 206 is a combination of a few quantum wells 208a, 208b, 208c, 208d, and the barriers between those wells, where energy states are carefully designed so that optical transition of electrons is enabled. The energy difference between upper laser state 204a and lower laser state 204b corresponds to the energy of a photon emitted. This energy difference can be expressed as: $\Delta E = h\nu = h*(c/\lambda)$, where h is Planck's constant, c is the speed of light, $\lambda$ is the wavelength of the photon emitted.

High power (Watt level) continuous wave (CW) room temperature operation of QCLs has been demonstrated in the wavelength range from 3.8 to 5 µm. However the output power and wall plug efficiency (WPE) in CW operation are generally less than in pulsed operation, because the internal heating in the laser core degrades laser performance. The internal heating is usually unavoidable, due to low wall plug efficiency of the QCL. However, if a QCL is designed for high temperature performance or less performance degradation with increased temperature, the QCL structure can perform better in CW operation than other regular designs. The QCLs with high temperature performance are attractive for high power, high wall plug efficiency, and uncooled operations to reduce the heat sinking requirement and package size.

The temperature performance of a QCL is characterized with two parameters, $T_0$ and $T_1$. $T_0$ refers to how the threshold changes with temperature and is defined by the formula $J_{th}=J_0 \exp(T/T_0)$, where $J_{th}$ is the threshold current density, T is the operating temperature (under pulsed condition), and $J_0$ is a characteristic threshold current density. $T_1$ represents the decrease of slope efficiency with temperature increase and is defined by: $\eta=\eta_0 \exp(-T/T_1)$, where $\eta$ is the slope efficiency and $\eta_0$ is a characteristic slope efficiency. Generally, the values of $T_0$ and $T_1$ are in the range of about 100 to about 200K for a two-phonon design.

Figure 3:
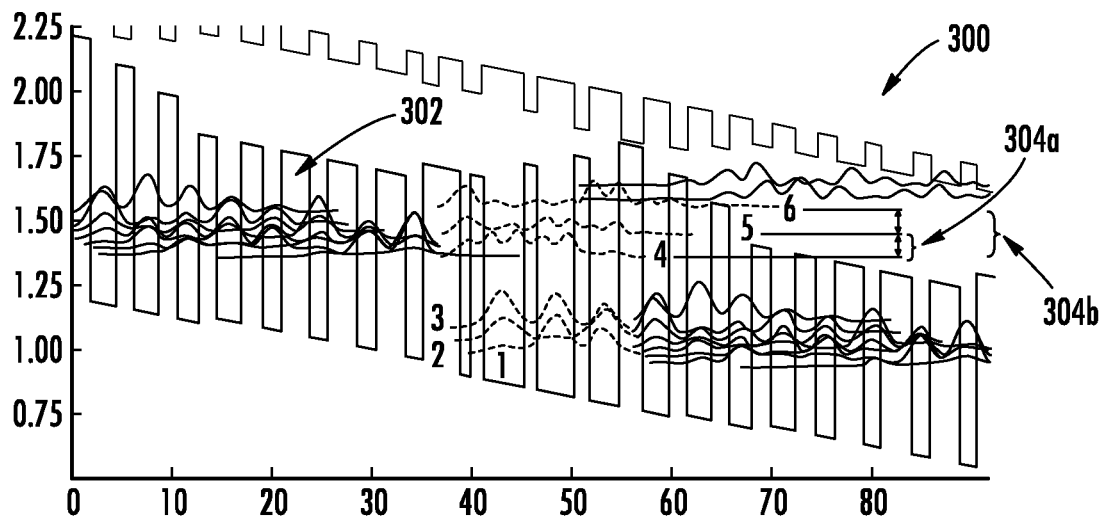
FIG. 3 depicts a band diagram, further illustrating an increased difference between energy state 4 and energy state 5.

FIG. 3 depicts a band diagram, further illustrating an increased difference between energy state 4 and energy state 5. As illustrated, energy in electron Volts (eV) is shown on the y-axis, while distance in nanometers (nm) is shown in on the x-axis. Electron leakage through parasitic energy states (state 5 and 6) above the upper laser state 302 is one of the reasons of poor temperature performance. Some designs of QCLs have high energy separation of between the parasitic states and upper laser state. Accordingly, a high energy value for E54 304a of about 84 meV and a high energy value for E64 304b of about 185 meV results in a high $T_1$ value (about 450K and in some embodiments ranges from about 400K to about 500K). However, $T_0$ may be about 180K (and in some embodiments range from about 150K to about 200K).

Figure 4:
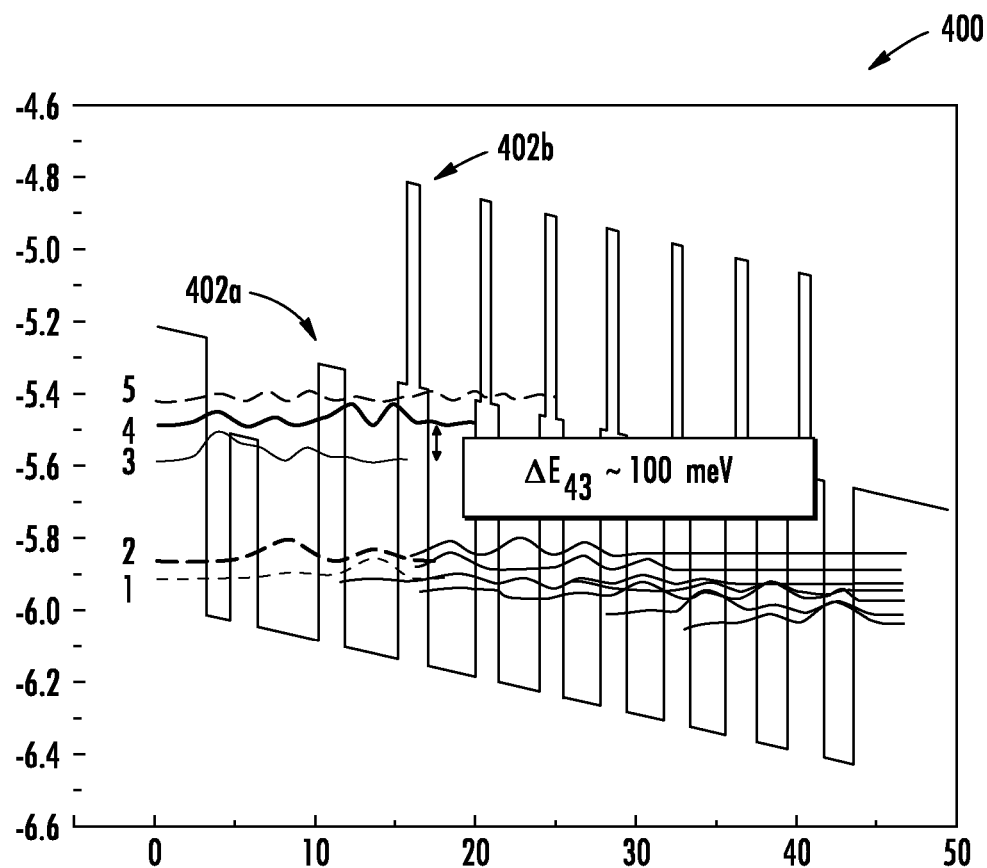
FIG. 4 depicts a band diagram, further illustrating an increased difference between energy state 3 and energy state 4.

FIG. 4 depicts a band diagram, further illustrating an increased difference between energy state 3 and energy state 4. As illustrated, energy in electron Volts (eV) is shown on the y-axis, while distance in nanometers (nm) is shown in on the x-axis. Additionally, a structure with high E43 to achieve high temperature performance, as shown in FIG. 3. In both FIGS. 3 and 4, similar strategies to increase the E54 value may include increasing the effective height of a barrier 402 for the last couple of quantum wells in the active region, or to increase the effective barrier height difference between the first barrier (close to the injection barrier) and the last one or two barriers 402a, 402b (close to the extraction barrier). If the last two barriers 402a, 402b are made thicker or higher, the parasitic state 4, which lies above the upper lasing state, will be pushed upward because its electron distribution density is high in the barriers. However, at the same time, the upper laser state 3 will be pushed upward less, because its electron distribution density of state 3 is smaller in those barriers. That is how the energy difference E43 increases to about 100 meV (and in some embodiments E43 ranges from about 80 meV to about 120 meV) from typical 40 meV. Some embodiments may achieve a high $T_1$ (about 640K and in some embodiments ranging from about 600K to about 700K) with this design and higher $T_0$ (about 380K and in some embodiments ranging from about 350K to about 450K) than a regular structure at the same time.

As discussed in more detail below with regard to FIG. 5, the embodiments disclosed herein have also increased energy difference E54 in a QCL. Not only is the conduction band energy level of a barrier increased for the final barrier or final few barriers, but in this disclosed embodiment, the conduction band energy level of the bottom of the final well (or final few wells) is lowered than that of previous wells in the active region.

Lowering the bottom of at least one final quantum well may result in not only lowering the energy level 5, but also raising energy level 5, in order to keep the same energy levels from 1 to 3 for efficiency depopulation of lower lasing state by decreasing the thickness of the well. The energy difference E54 is determined by these opposite effects. The energy level 5 is mainly determined by the second quantized energy level of the final quantum well, and the energy level 1 (or level 2) is mainly determined by the first energy level of the final quantum well.

A simple example may include a single quantum well with infinite barrier. The energy positions of the first two energy states with respect to the bottom of a 1 dimensional infinite quantum well follow the formula: $e(n)=n^2*h^2/(8*m*L^2)$, where n is the number of the state, h is Planck's constant, m is the particle mass (electron mass in this example), and L is the thickness of the quantum well. Therefore $e(1)$ is $h^2/(8*m*L^2)$, $e(2)$ is $4*h^2/(8*m*L^2)$, and the difference $e2-e1=3*h^2/(8*m*L^2)$. With a fixed position (in energy space) of level 1 and increased e1 (by lowering the bottom of the well), L must be decreased. Then with a fixed position of level 1 and decreased L, the energy position of level 2 may be increased, because of the increased value of e2-e1.

Although in a real case of a quantum cascade laser, the active region is actually made of coupled quantum wells with finite barriers, the basic principle still applies: with decreased thickness and lowered bottom portion of the well, the energy of the second level (or E5 in the FIG. 5) will be increased. At the same time, the upper laser state (E4) will be much less affected. Therefore the energy difference between energy state 5 and energy state 4 (E54) can be significantly increased without the change having much influence on the other energy states.

Accordingly, embodiments disclosed herein include a quantum cascade laser active region that has a quantum well with lower conduction band energy (e.g., more In-rich GaInAs) than the quantum well where the main lobe of the lower laser state wave function is located. With this component, a step-like quantum well region forms in the active region. This may result in high E54 for achieving high $T_0$ and $T_1$, without introducing other negative impact to the laser performance. Better continuous wave (CW) performance, namely higher CW output power and wall plug efficiency (WPE), has been demonstrated.

In the active region of a QCL structure, there are more than one set of compositions of strained well and barrier materials, for example $In_xGa_{1-x}As/In_yAl_{1-y}As$. The higher the strain (higher x) of the well material, the lower the energy position of the bottom of the well is. In embodiments, in the active region, and when the active region is under operating bias, there is at least one well which has higher compressive strain than the well where the main lobe of the wave function of the lower laser state is located. The effect is to increase the energy separation between upper laser state and the parasitic state above the upper laser state (or the energy difference E54). In the case of single quantum well with infinite barrier (discussed above), the increase of e2−e1 is 3 times of the increase of e1, namely 3 times of the energy with which the bottom of the well is lowed. Again, in the real active region of a QCL, the ratio is smaller than 3, because of the finite barriers and coupled quantum wells. Regardless, to increase the energy separation (E54) with Δ (meV), the energy difference of the bottoms of the wells may be configured to be not less than Δ/3. Moreover, the strain of last a couple of barriers can be also higher than others in the active region, to enhance the effect.

The first part of the injector (or the first a few quantum wells adjacent the final quantum well of the active region) has the same deep well structure (same strain of barrier and well materials) as the deep well in the active region. This is not necessary, but it helps to push the leaking path to continuum (or the states above level 5) upward.

Figure 5:
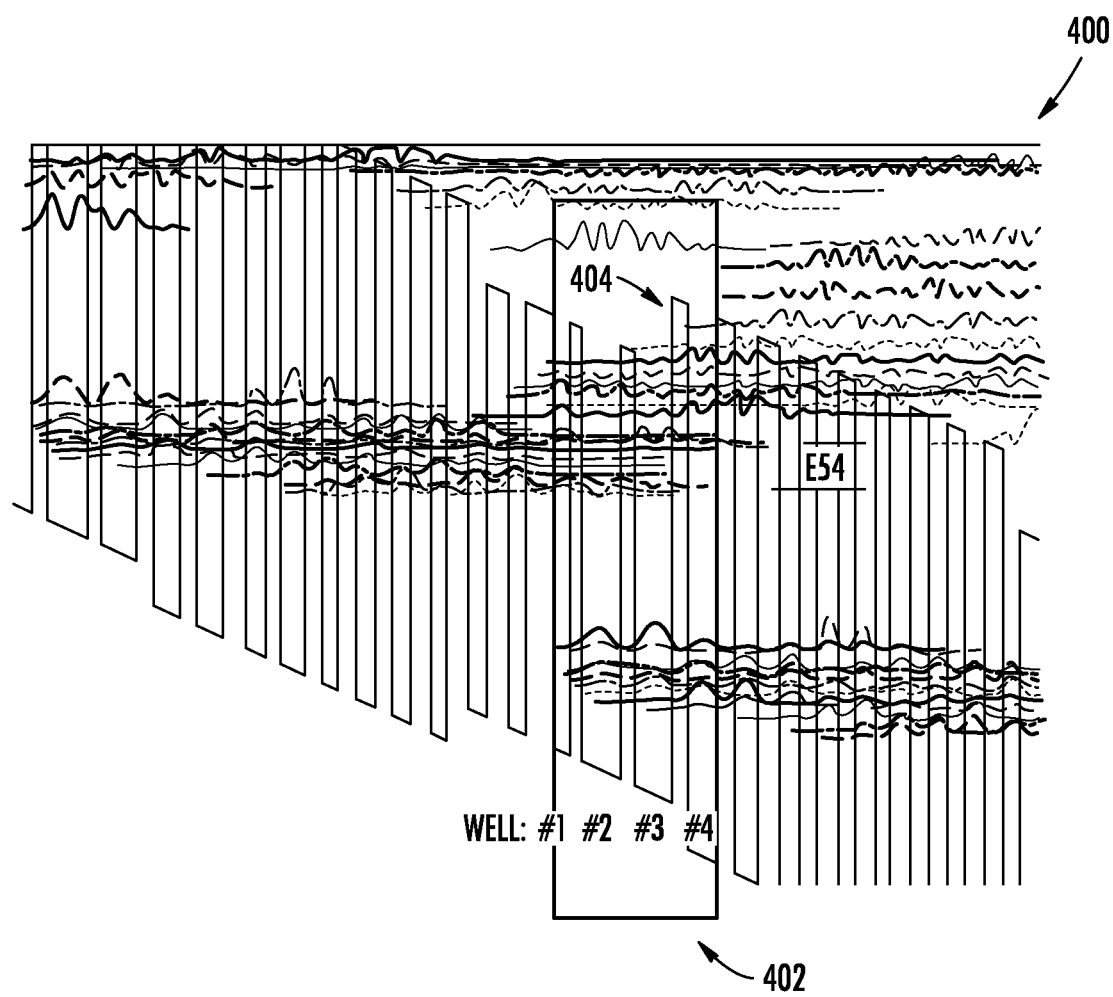
FIG. 5 depicts a band diagram, further illustrating a final well in the active region being lowered and a barrier in the active region being raised to increase an energy difference between energy state 4 and energy state 5.

One example of this design is shown in FIG. 5. FIG. 5 depicts a band diagram, further illustrating a final well in the active region being lowered and a barrier in the active region being raised to increase an energy difference between energy state 4 and energy state 5. The lasing wavelength in this example is about 4.8 μm and in some cases may be from about 3 μm to about 12 μm. As illustrated, there are four wells in the active region 502, labeled #1, #2, #3, and #4. As discussed in more detail below and illustrated in Table 1, the bottom portion of quantum well #4 has been extended downward, below the bottom portions of the other quantum wells, such as a major quantum well in the active region 402. This may be accomplished by altering the Gallium to Indium proportion, such that there is less Gallium to Indium, when compared with other quantum wells in the active region. Additionally, in this embodiment, the thickness of the quantum well #4 may be reduced to a thickness such that the bottom subband energy is not lower than in regular QCLs. In some embodiments of QCL, or regular two-phonon design of QCLs, well #4 may be about 1 to about 5 Angstroms thinner than well #3. So, well #4 may have a thickness from about 32 Angstroms to about 36 Angstroms in the regular two-phonon design, if the well #3 is about 37 Angstroms thick. In this embodiment, the thickness of well #4 is only 29 Angstroms, and in some embodiments it can vary from about 25 Angstroms to 30 Angstroms, depending on specific embodiments. Such a configuration may increase E54, which increases $T_0$ and/or $T_1$. Similarly, in some embodiments, a final barrier energy 404 may be extended beyond a top portion of the energy of other barriers in the active region 402.

It should be understood that while in some embodiments, the bottom portion of the final quantum well may be lowered below the bottom portion of the other quantum wells in the active region 402; in some embodiments, the bottom portion of a plurality of final quantum wells may be lowered. Similarly, in some embodiments, a plurality of final barriers may be extended in the energy beyond the other barriers in the active region 402.

As an example, the growth structure of one stage/period of active core is listed in Table 1.

TABLE 1

| | |
|---|---|
| $Al_{0.63}In_{0.37}As$ | 34 Å |
| $Ga_{0.39}In_{0.61}As$ (well #1)* | 12 Å |
| $Al_{0.63}In_{0.37}As$* | 13 Å |
| $Ga_{0.39}In_{0.61}As$ (well #2)* | 41.5 Å |
| $Al_{0.63}In_{0.37}As$* | 15 Å |
| $Ga_{0.39}In_{0.61}As$ (well #3)* | 37 Å |
| $Al_{0.72}In_{0.28}As$* | 16 Å |
| $Ga_{0.22}In_{0.78}As$ (well #4)* | 29 Å |
| $Al_{0.72}In_{0.28}As$ | 20 Å |
| $Ga_{0.22}In_{0.78}As$ | 26.5 Å |
| $Al_{0.72}In_{0.28}As$ | 22 Å |
| $Ga_{0.22}In_{0.78}As$ | 23 Å |
| $Al_{0.72}In_{0.28}As$ | 18 Å |
| $Ga_{0.22}In_{0.78}As$ | 21 Å |
| $Al_{0.72}In_{0.28}As$ | 17 Å |
| $Ga_{0.22}In_{0.78}As$ | 20 Å |
| $Al_{0.72}In_{0.28}As$ | 18 Å |
| $Ga_{0.22}In_{0.78}As$ | 20 Å |
| $Al_{0.72}In_{0.28}As$ | 19 Å |
| $Ga_{0.22}In_{0.78}As$ | 18.5 Å |
| $Al_{0.72}In_{0.28}As$ | 21 Å |
| $Ga_{0.22}In_{0.78}As$ | 17 Å |
| $Al_{0.72}In_{0.28}As$ | 22 Å |
| $Ga_{0.39}In_{0.61}As$ | 17 Å |
| $Al_{0.63}In_{0.37}As$ | 26 Å |
| $Ga_{0.39}In_{0.61}As$ | 16 Å |

In Table 1, layers that lie in the active region are marked with an asterisk (*). There are two sets of well/barrier materials with different strain. In FIG. 5, the main lobe of the wave function of the lower lasing state located in the well #3. Well #4 has a higher strain and lower well bottom than well #3 (about 65 meV). As a result, the energy difference E54 is about 90 meV and in some embodiments, between about 80 meV and 100 meV; much higher than the regular value (40 meV).

Additionally, the structure of FIG. 5 demonstrates high $T_0$ and $T_1$ values. The average $T_0$ is about 177K and may range from about 140K to about 200K, and the average $T_1$ is about 366K, which may range from about 300K to about 450K, depending on the embodiment. These values are higher than the values of a typical two-phonon design ($T_0$ may be about 127K and $T_1$ may be about 135K). At the same time, the total WPE under room temperature pulse operation is about 15%, similar to the typical value of 16% of a two-phonon design.

What is claimed is:

1. A quantum cascade laser structure comprising a plurality of quantum wells and a plurality of barriers, at least a portion of which define an active region, wherein:
   a photon is emitted in the active region when an electron transitions from an upper laser state in the active region to a lower laser state in the active region;
   a final quantum well in the plurality of quantum wells that define the active region, the final quantum well extending below an adjacent quantum well in the active region when no bias is applied; and
   the final quantum well comprises a thickness that is less than a thickness of the adjacent quantum well in the active region.

2. The quantum cascade laser structure of claim 1, wherein the active region comprises 4 quantum wells.

3. The quantum cascade laser structure of claim 1, wherein a final barrier in the plurality of barriers comprises an height that is greater than other barriers of the plurality of barriers.

4. The quantum cascade laser structure of claim 3, wherein an energy difference between two energy states is created and comprises a difference between an upper laser state 4 and a parasitic state 5, and wherein the energy difference is at least about 80 meV.

5. The quantum cascade laser structure of claim 3, the final barrier comprises Aluminum and Indium.

6. The quantum cascade laser structure of claim 5, wherein an Aluminum to Indium proportion in the final barrier is higher than that of the other barriers in the active region.

7. The quantum cascade laser structure of claim 3, wherein the final barrier in the active region comprises a thickness that is greater than thicknesses of the other barriers in the active region.

8. The quantum cascade laser structure of claim 1, wherein a thickness of the final quantum well is more than about 5 Angstroms less than a thickness the adjacent quantum well in the active region.

9. The quantum cascade laser structure of claim 1, wherein the final quantum well comprises a material that includes $Ga_xIn_{1-x}As$, where x varies from 0 to 1.

10. The quantum cascade laser structure of claim 1, wherein the plurality of barriers comprise a material that includes $Al_yIn_{1-y}As$, where y varies from 0 to 1.

11. The quantum cascade laser structure of claim 1, wherein the active region resides within an active core and wherein the quantum cascade laser structure further comprises a cladding layer.

12. The quantum cascade laser structure of claim 11, wherein the active core and the cladding layer are grown on an Indium Phosphide (InP) substrate.

13. The quantum cascade laser structure of claim 1, wherein the final quantum well comprises Gallium and Indium.

14. The quantum cascade laser structure of claim 13, wherein a Gallium to Indium proportion in the final quantum well is less than that of at least one of the plurality of quantum wells in the active region.

15. The quantum cascade laser structure of claim 1, wherein the plurality of quantum wells and the plurality of barriers defines an injector region, such that electrons transport from the active region to a next adjacent active region through the injector region.

16. The quantum cascade laser structure of claim 15, wherein the injector region comprises an entrance quantum well that comprises a depth that is greater than at least one of the plurality of quantum wells in the active region.

17. The quantum cascade laser structure of claim 15, wherein the injector region comprises an additional barrier that comprises a height that is greater than at least one of the plurality of barriers in the active region.

18. The quantum cascade laser structure of claim 1, wherein a lasing wavelength of the quantum cascade laser structure is from about 3 µm to about 12 µm.

19. A quantum cascade laser structure comprising at least one laser core and at least one cladding layer, forming a waveguide structure, the at least one laser core comprising a first type of semiconductor material that defines a plurality of quantum wells, the at least one laser core comprising a second type of semiconductor materials that define a plurality of barriers, wherein:

the plurality of quantum wells and the plurality of barriers define an active region, such that photons are emitted in the active region when electrons transition from an upper laser state in the active region to a lower laser state in the active region;

the plurality of quantum wells and the plurality of barriers define an injector region, such that electrons transport from one active region to a next adjacent active region through the injector region; and at least one final quantum well of the plurality of quantum wells comprises a bottom portion that extends below a major quantum well in the active region when no bias is applied.

20. A quantum cascade laser structure comprising 4 quantum wells and a plurality of barriers in an active region, the active region being configured for emitting a photon, wherein:

a final quantum well in the active region comprises a bottom portion that extends below other quantum wells in the active region when no bias is applied;

a final barrier in the active region comprises top portion that extends beyond other barriers in the active region, thereby increasing an energy difference E54 between energy state 4 and energy state 5; and the final barrier comprises a thickness that is greater than thicknesses of the other barriers in the active region.

* * * * *